United States Patent
Miyachi et al.

(10) Patent No.: US 7,176,619 B2
(45) Date of Patent: Feb. 13, 2007

(54) SELF-LUMINESCENCE IMAGE DISPLAY UNIT

(75) Inventors: Koichi Miyachi, Kyoto (JP); Motohiro Yamahara, Nara (JP); Yoshihiro Izumi, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 280 days.

(21) Appl. No.: 10/487,296

(22) PCT Filed: Jul. 18, 2002

(86) PCT No.: PCT/JP02/07328

§ 371 (c)(1),
(2), (4) Date: Feb. 20, 2004

(87) PCT Pub. No.: WO03/017239

PCT Pub. Date: Feb. 27, 2003

(65) Prior Publication Data
US 2004/0201341 A1    Oct. 14, 2004

(30) Foreign Application Priority Data
Aug. 21, 2001   (JP) ............................. 2001-250136

(51) Int. Cl.
*H01J 1/62* (2006.01)
(52) U.S. Cl. .................................... 313/506
(58) Field of Classification Search ........ 313/110–117, 313/506
See application file for complete search history.

(56) References Cited

U.S. PATENT DOCUMENTS

| | | | |
|---|---|---|---|
| 6,433,853 B1 * | 8/2002 | Kameyama et al. | 349/176 |
| 6,493,051 B2 | 12/2002 | Ha et al. | |
| 2001/0036013 A1 * | 11/2001 | Allen et al. | 359/599 |
| 2002/0093284 A1 * | 7/2002 | Adachi et al. | 313/506 |

FOREIGN PATENT DOCUMENTS

| | | |
|---|---|---|
| JP | 4-218025 | 8/1992 |
| JP | 8-321381 | 5/1995 |
| JP | 9-127885 | 10/1995 |
| JP | 2001-35653 | 7/1999 |
| JP | 2000-113988 | * 4/2000 |
| KR | 2001-0054318 | 2/2001 |

* cited by examiner

*Primary Examiner*—Joseph Williams
*Assistant Examiner*—Bumsuk Won
(74) *Attorney, Agent, or Firm*—David G. Conlin; David A. Tucker; Edwards Angell Palmer & Dodge LLP

(57) ABSTRACT

A self-luminous image display apparatus of the present invention includes an output section for displaying an image, a reflection section provided on a rear side of the output section with a reflective surface thereof facing the output section, and a light-emitting section provided on a rear side of the output section. The output section includes a linear polarization device provided so as to cover a display surface for transmitting only predetermined linearly-polarized light of ambient light, and a retardation film provided closer to the light-emitting section than the linear polarization device for turning the linearly-polarized light transmitted through the linear polarization device into circularly-polarized light. The linear polarization device has a degree of polarization greater than 70.0%.

16 Claims, 4 Drawing Sheets

SELF-LUMINESCENCE IMAGE DISPLAY UNIT

TECHNICAL FIELD

The present invention relates to a self-luminous image display apparatus including an output section for displaying an image, a reflection section provided on the rear side of the output section with the reflective surface thereof facing the output section, and a light-emitting section provided on the rear side of the output section.

BACKGROUND ART

An organic electroluminescence display (hereinafter referred to as "organic EL display") is an application of the phenomenon that an organic thin film having a thickness of about 1 μm emits light when a current is injected into the organic thin film, and it has been actively researched and developed in recent years. A typical structure of the organic EL display is a layered structure including an output-side substrate 10', a reflection-side substrate 20' and an organic EL light-emitting layer 30' interposed between the substrates 10' and 20', as illustrated in FIG. 7. The output-side substrate 10' includes an output-side substrate body 11', a transparent electrode 12' made of ITO (Indium Tin Oxiside) provided on the inner side of the output-side substrate body 11', and a hole injection/transfer layer 13' provided on the inner side of the transparent electrode 12'. The reflection-side substrate 20' includes a reflection-side substrate body 21' and a metal electrode 22' made of aluminum. In an organic EL display having such a structure, a portion of light from the organic EL light-emitting layer 30', which emits light omnidirectionally, that travels toward the output-side substrate 10' is output directly from the output-side substrate 10', while another portion of the light that travels toward the reflection-side substrate 20' is output indirectly from the output-side substrate 10' after being reflected by the metal electrode 22' having a mirror surface, thus efficiently taking out the light emitted from the organic EL light-emitting layer 30'.

An organic EL display has a problem as follows when it is used under the sunlight or in the presence of room light, as is a portable telephone, or the like. That is, when ambient light such as the sunlight or room light enters the organic EL display through the output-side substrate, the ambient light is reflected by the metal electrode and is output through the output-side substrate, and the contrast of the organic EL display is lowered significantly by the ambient light reflection.

To address this problem, Japanese Laid-Open Patent Publication No. 8-321381 discloses the provision of a circular polarization plate including a linear polarization plate and a retardation plate on the transparent electrode side of an organic EL display, and Japanese Laid-Open Patent Publication No. 9-127885 discloses a light emitting device in which circular polarization means including a linear polarization plate and a ¼ wave plate is provided on the light-outputting surface side. According to the disclosure of these publications, half of the ambient light is blocked by a linear polarization plate. The linearly-polarized light of the remaining half of the ambient light transmitted through the linear polarization plate is turned into circularly-polarized light (e.g., right-handed circularly-polarized light) by a retardation plate or a ¼ wave plate, and then passes through a transparent electrode, after which it is turned into circularly-polarized light of the reverse direction (right-handed circularly-polarized light being turned into left-handed circularly-polarized light) as it is reflected by an aluminum electrode. Then, the circularly-polarized light of the reverse direction is turned into linearly-polarized light by the retardation plate or the ¼ wave plate. However, the polarization axis of the linearly-polarized light has been rotated by 90° with respect to that of the original linearly-polarized light, whereby the linearly-polarized light is blocked by the linear polarization plate. Therefore, all of the ambient light incident on the organic EL display is blocked by the linear polarization plate, thus preventing the reflection of the ambient light from entering the viewer's eye, thereby preventing the contrast from being lowered by the ambient light reflection.

On the other hand, in an organic EL display provided with a linear polarization plate and a retardation plate or a ¼ wave plate, half of the light from the EL light-emitting layer is also blocked and lost by the linear polarization plate, thereby reducing the luminance by half, as compared to a case where these members are not provided, and such an organic EL display will require twice as much power as an organic EL display where these members are not provided in order to obtain an equal level of luminance.

To address this problem, Japanese Laid-Open Patent Publication No. 2001-35653 discloses a filter for an organic EL panel including a ¼ wave plate, a polarization plate and an antiglare layer, wherein the degree of polarization of the polarization plate is 50 to 70%, and states that it is possible with such an arrangement to obtain an organic EL panel with a high visibility that is glare-free and capable of displaying sharp images.

Moreover, Japanese Laid-Open Patent Publication No. 4-218025 discloses a reflection type liquid crystal display device including a liquid crystal cell, including a pair of substrates opposing each other and a liquid crystal material interposed therebetween, a polarization plate provided on each side of the liquid crystal cell, and a reflection plate provided on one side of the liquid crystal cell, wherein a polarization plate having a low degree of polarization is used as the polarization plate on the reflection plate side, thus improving the overall brightness.

DISCLOSURE OF THE INVENTION

An object of the present invention is to provide a self-luminous image display apparatus capable of reliably providing a high contrast while preventing the reflection of the ambient light from being output from the apparatus.

In order to achieve the object set forth above, the present invention provides a linear polarization device whose degree of polarization is greater than 70.0% and 99.2% or less in an output section or output-side substrate, thereby significantly improving the contrast from that obtained by using a linear polarization device whose degree of polarization is 70.0% or less, while improving the luminance by 10% or more from that obtained by using a linear polarization device whose degree of polarization is 99.9%.

Specifically, the present invention provides a self-luminous image display apparatus, including an output section for displaying an image, a reflection section provided on a rear side of the output section with a reflective surface thereof facing the output section, and a light-emitting section provided on a rear side of the output section, wherein: the output section includes a linear polarization device provided so as to cover a display surface for transmitting only predetermined linearly-polarized light of ambient light, and a retardation film provided closer to the light-emitting section than the linear polarization device for turning the linearly-polarized light transmitted through the linear polarization device into circularly-polarized light; and the linear polarization device has a degree of polarization greater than 70.0% and 99.2% or less.

The present invention also provides a self-luminous image display apparatus, including an output-side substrate, a reflection-side substrate provided so as to oppose the output-side substrate, and a light-emitting layer provided so as to be interposed between the substrates, wherein light from the light-emitting layer is output directly from the output-side substrate and is output indirectly from the output-side substrate after being reflected by the reflection-side substrate, wherein: the output-side substrate includes a linear polarization device provided so as to cover a display surface for transmitting only predetermined linearly-polarized light of ambient light, and a retardation film provided closer to the light-emitting layer than the linear polarization device for turning the linearly-polarized light transmitted through the linear polarization device into circularly-polarized light; and the linear polarization device has a degree of polarization greater than 70.0% and 99.2% or less.

With these arrangements set forth above, the linear polarization device and the retardation film are provided on the output side, thereby preventing the reflection of the ambient light from being output from the apparatus. In addition, since the degree of polarization of the linear polarization device is greater than 70.0%, the apparatus reliably exhibits a high contrast equal to or greater than a practical level of 5. Moreover, since the degree of polarization of the linear polarization device is 99.2% or less, the luminance is improved by 10% or more from that obtained by using a linear polarization device whose degree of polarization is 99.9%.

In the present invention, it is preferred that the degree of polarization of the linear polarization device is 78.0% or more. With such an arrangement, it is possible to realize a contrast equal to Or greater than 10, which is considered to be a very high quality in practical use.

In the present invention, it is preferred that the degree of polarization of the linear polarization device is 99.0% or less. With such an arrangement, the luminance is improved by 10% or more, as compared to a case where a linear polarization device whose degree of polarization is substantially 100.0% is used, whereby it is possible to effectively improve the luminance, which is decreased due to the provision of the linear polarization device and the retardation film. In order to improve the luminance, it is preferred to use a linear polarization device whose degree of polarization is 85.0% or less, in which case the luminance is improved by about 20% or more, as compared to a case where a linear polarization device whose degree of polarization is substantially 100.0% is used. On the other hand, in the range of degree of polarization from 70.0 to 99.0%, the luminance improvement varies by only less than 10% whereas the contrast varies quite substantially in the same range of degree of polarization. Thus, in order to obtain a very high contrast while also improving the luminance to a certain degree, it is preferred to use a linear polarization device whose degree of polarization is 90.0 to 99.0%, more preferably 95.0 to 99.0%, and most preferably 97.0 to 99.0%.

The self-luminous image display apparatus of the present invention is particularly effective for apparatuses used primarily under the sunlight, such as apparatuses whose display mode is an electroluminescence display mode or a field emission display mode. Herein, the electroluminescence display mode includes both the organic electroluminescence display mode and the inorganic electroluminescence display mode.

Other objects, features, and advantages of the present invention will become apparent from the following description taken in conjunction with the accompanying drawings.

BEST MODE FOR CARRYING OUT THE INVENTION

An embodiment of the present invention will now be described in detail with reference to the drawings.

Figure 1:
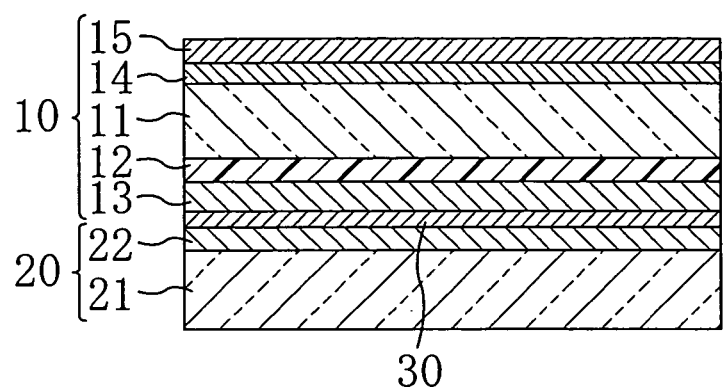
FIG. 1 is a schematic cross-sectional view illustrating an organic EL display of the present invention.

FIG. 1 schematically illustrates a cross section of an organic EL display A, which is a self-luminous image display apparatus of the present invention.

The organic EL display A includes an output-side substrate (output section) 10, a reflection-side substrate (reflection section) 20 opposing the output-side substrate 10, and an organic EL light-emitting layer (light-emitting section) 30 interposed between the substrates 10 and 20. In other words, the organic EL light-emitting layer 30 is provided on the rear side of the output-side substrate 10, and the reflection-side substrate 20 is provided on the rear side of the organic EL light-emitting layer 30.

The output-side substrate 10 includes an output-side substrate body 11 being a glass plate, a transparent electrode 12 being an anode and a hole injection/transfer layer 13 layered in this order on the inner side of the output-side substrate body 11, and a ¼ wave plate (retardation film) 14 and a linear polarization plate (linear polarization device) 15 layered in this order on the outer side of the output-side substrate body 11. The output-side substrate 10 is for displaying an image.

The transparent electrode 12 on the inner side of the output-side substrate body 11 is made of ITO (Indium Tin Oxiside), or the like, and is for injecting holes into the hole injection/transfer layer 13. Moreover, the transparent electrode 12 includes a plurality of pixel electrodes arranged in a lattice pattern and each defining one pixel. Each pixel electrode is provided with a switching device such as a TFT (Thin Film Transistor). Thus, the organic EL display A is an active matrix mode.

The hole injection/transfer layer 13 is made of a phthalocyanine compound, an aromatic amine compound, or the like, and is for transferring holes injected from the transparent electrode 12 to the organic EL light-emitting layer 30.

Figure 2:
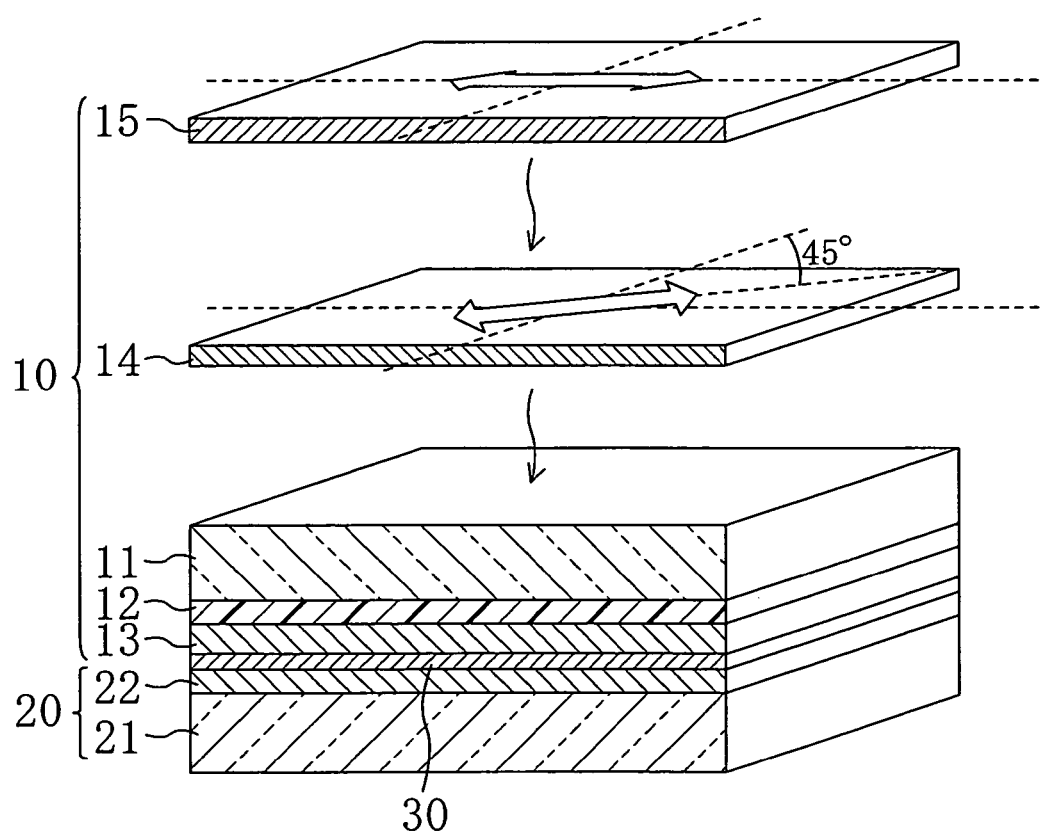
FIG. 2 illustrates the positional relationship between a linear polarization plate and a ¼ wave plate.

The ¼ wave plate 14 is provided in the form of a film and is a device having a function of changing the phase difference by ¼ the wavelength. Moreover, the linear polarization plate 15 is provided in the form of a film and is a device having a function of transmitting only light of a particular oscillation direction (polarization axis direction). The ¼ wave plate 14 and the linear polarization plate 15 are arranged so that the slow axis of the ¼ wave plate 14 and the polarization axis (transmission axis) of the linear polarization plate 15 are at an angle of 45°, as illustrated in FIG. 2. In this way, linearly-polarized light transmitted through the linear polarization plate 15 can be turned into circularly-polarized light by the ¼ wave plate 14.

A linear polarization plate whose degree of polarization is greater than 70.0% is used as the linear polarization plate 15. In this way, it is possible to reliably obtain a high contrast equal to or greater than a practical level of 5. For example, a viewing angle range of a liquid crystal display is typically defined as a range in which a contrast of 5 or more can be obtained, and the contrast level of 5 also corresponds to that of printed matter such as newspaper. Thus, it is a level at or above which the display will have no problem in practical use. Moreover, it is more preferred to use a linear polarization plate whose degree of polarization is 78.0% or more, in which case it is possible to realize a contrast equal to or greater than 10, which is considered to be a very high quality in practical use. The contrast level of 10 is a very high quality for a display apparatus. Moreover, a linear polarization plate whose degree of polarization is 99.2% or less is used as the linear polarization plate 15. In this way, the luminance can be improved by 10% or more from that obtained by using a linear polarization plate whose degree of polarization is 99.9%. In order to improve the luminance, it is preferred to used a linear polarization plate whose degree of polarization is 85.0% or less. On the other hand, in order to obtain a very high contrast while also improving the luminance to a certain degree, it is preferred to use a linear polarization plate whose degree of polarization is 90.0 to 99.0%, more preferably 95.0 to 99.0%, and most preferably 97.0 to 99.0%.

The reflection-side substrate 20 includes a reflection-side substrate body 21 being a glass plate, and a metal electrode 22 being a cathode and common electrode layered on the inner side of the reflection-side substrate body 21.

The metal electrode 22 on the inner side of the reflection-side substrate body 21 is made of aluminum, magnesium, or the like, is formed with a mirror surface, and is for injecting electrons into the organic EL light-emitting layer 30.

The organic EL light-emitting layer 30 is a thin film having a thickness of about 1 μm and made of an organic phosphor such as an aromatic cyclic compound or a heterocyclic compound, and emits light upon recombination of electrons from the metal electrode 22 and holes from the transparent electrode 12 and the hole injection/transfer layer 13.

In the organic EL display A having such an arrangement, as a DC voltage is applied between the metal electrode 22 being an anode and the transparent electrode 12 being a cathode, electrons are injected into the organic EL light-emitting layer 30 from the metal electrode 22 while holes are injected into the organic EL light-emitting layer 30 from the transparent electrode 12 via the hole injection/transfer layer 13, and the electrons and the holes are recombined together to emit light of a predetermined wavelength. The light emission is omnidirectional, and a portion of the light that travels toward the output-side substrate 10 is output directly from the output-side substrate 10, while another portion of the light that travels toward the reflection-side substrate 20 is output indirectly from the output-side substrate 10 after being reflected by the metal electrode 22, thus efficiently taking out the light emitted from the organic EL light-emitting layer 30.

Moreover, half of ambient light such as the sunlight or room light is blocked by the linear polarization plate 15, while the linearly-polarized light of the remaining half of the ambient light passing through the linear polarization plate 15 is turned into circularly-polarized light (e.g., right-handed circularly-polarized light) by the ¼ wave plate 14, and then passes through the inside, after which it is turned into circularly-polarized light of the reverse direction (right-handed circularly-polarized light being turned into left-handed circularly-polarized light) as it is reflected by the mirror-surfaced metal electrode 22 facing the output-side substrate 10. Then, the circularly-polarized light of the reverse direction passes again through the inside to reach the ¼ wave plate 14, where it is turned into linearly-polarized light. However, the polarization axis of the linearly-polarized light has been rotated by 90° with respect to that of the original linearly-polarized light, whereby the linearly-polarized light is blocked by the linear polarization plate 15. In this way, all of the ambient light incident on the organic EL display A is blocked by the linear polarization plate 15, thus preventing the ambient light reflected by the metal electrode 22 from being output.

While a specific embodiment of the present invention has been disclosed herein, the present invention may be carried out in various other ways without departing from the spirit or essential features thereof. Thus, the embodiment set forth above is merely illustrative in every respect, and should not be taken as limiting. The scope of the present invention is defined by the appended claims, and not by the description set forth above. Therefore, any variations that are equal or equivalent to the claims fall within the scope of the present invention.

For example, while the organic EL display A is used as the self-luminous image display apparatus in the embodiment above, the present invention is not limited to this, but may alternatively be used in an inorganic EL display, a plasma display, a cold-cathode tube display, a light-emitting diode display, or the like. Particularly, the present invention can be used effectively and suitably as a field emission display that is used primarily under the sunlight.

Moreover, while the organic EL display A is an active matrix mode in the embodiment above, the present invention is not limited to this, but may alternatively be used in a passive matrix mode or a segment mode.

Moreover, an electron injection/transfer layer, which is not provided in the embodiment above, may alternatively be provided between the metal electrode 22 and the organic EL light-emitting layer 30.

EXPERIMENT

Tested Samples

The following ten different linear polarization plates having different degrees of polarization were used as samples to be tested.

Sample 1

A linear polarization plate having a degree of polarization of 99.9% was used as Sample 1.

Sample 2

A linear polarization plate having a degree of polarization of 98.9% was used as Sample 2.

Sample 3

A linear polarization plate having a degree of polarization of 97.6% was used as Sample 3.

Sample 4

A linear polarization plate having a degree of polarization of 95.0% was used as Sample 4.

Sample 5

A linear polarization plate having a degree of polarization of 91.3% was used as Sample 5.

Sample 6

A linear polarization plate having a degree of polarization of 85.2% was used as Sample 6.

Sample 7

A linear polarization plate having a degree of polarization of 77.9% was used as Sample 7.

Sample 8

A linear polarization plate having a degree of polarization of 71.3% was used as Sample 8.

Sample 9

A linear polarization plate having a degree of polarization of 63.0% was used as Sample 9.

Sample 10

A linear polarization plate having a degree of polarization of 55.7% was used as Sample 10.

Test Method

Luminance and Luminance Improvement

Each of the linear polarization plates of Samples 1 to 10 was used in an organic EL display similar in structure to that of the embodiment above, and was measured for the luminance of the display surface. Note that the measurement was performed under conditions where the signal current was adjusted so that the luminance in the absence of the linear polarization plate and the ¼ wave plate, i.e., the luminance of the organic EL light-emitting layer, was 195.0 cd/m².

The improvement in luminance was calculated in percent for Samples 2 to 10 with respect to the luminance of Sample 1 as a reference. Note that the ¼ wave plate used was a ¼ wave plate made of polycarbonate and exhibiting a retardation of 135 nm for light having a wavelength of 550 nm.

Contrast

A contrast measurement apparatus was placed in front of an organic EL display similar in structure to that of the embodiment above in an ordinary lit room. The signal current was adjusted so that the luminous intensity of the organic EL light-emitting layer was 195.0 cd/m². Moreover, the brightness of the room light was adjusted so that the contrast was 2.0 in the absence of the linear polarization plate and the ¼ wave plate. The conditions were set so that the contrast measurement was performed under an environment where the intensity of light emitted from the organic EL display that is incident on the contrast measurement device is substantially equal to the intensity of the reflection of the room light that is incident on the contrast measurement device.

The linear polarization plates of Samples 1 to 10 were placed in organic EL displays and successively measured for the contrast under the conditions as described above.

Test Results

The test results for the luminance, the luminance improvement and the contrast are shown in Table 1. Moreover, FIG. 3 illustrates the relationship between the degree of polarization and the luminance, FIG. 4 the relationship between the degree of polarization and the luminance improvement, and FIG. 5 the relationship between the degree of polarization and the contrast.

TABLE 1

| Samples | Degree of Polarization % | Luminance cd/m | Luminance Improvement % | Contrast |
|---|---|---|---|---|
| 1 | 99.9 | 76.7 | 0.0 | 306.5 |
| 2 | 98.9 | 87.5 | 14.1 | 85.2 |
| 3 | 97.6 | 89.2 | 16.3 | 45.7 |
| 4 | 95.0 | 89.5 | 16.7 | 25.2 |
| 5 | 91.3 | 91.2 | 18.9 | 19.0 |
| 6 | 85.2 | 92.5 | 20.6 | 13.6 |
| 7 | 77.9 | 93.3 | 21.6 | 10.1 |
| 8 | 71.3 | 95.3 | 24.3 | 5.4 |
| 9 | 63.0 | 101.9 | 32.9 | 4.4 |
| 10 | 55.7 | 115.2 | 50.2 | 2.4 |
| no plates | — | 195.0 | 154.2 | 2.0 |

Figure 3:
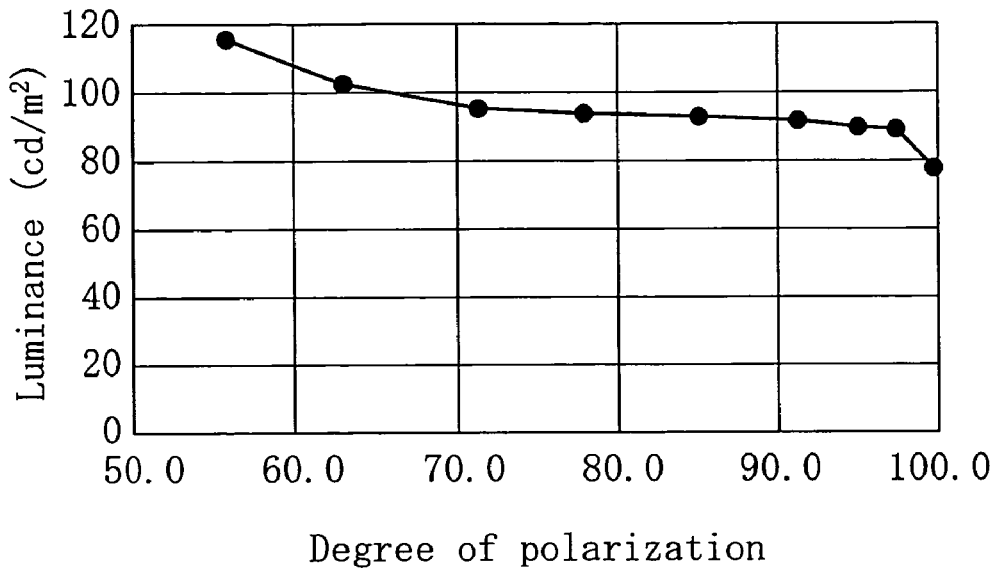
FIG. 3 is a graph illustrating the relationship between the degree of polarization and the luminance.

It can be seen from FIG. 3 that in the range of degree of polarization from 50 to 70, the luminance decreases relatively substantially for the increase in the degree of polarization. In contrast, in the range of degree of polarization from 70 to the high 90's, the decrease in the luminance for the increase in the degree of polarization is not so substantial, with the luminance being generally constant in this range. Moreover, it is also seen that the decrease in the luminance is quite substantial in the range of degree of polarization in the high 90's, i.e., between Sample 9 whose degree of polarization is 98.9 and Sample 10 whose degree of polarization is 99.9.

Figure 4:
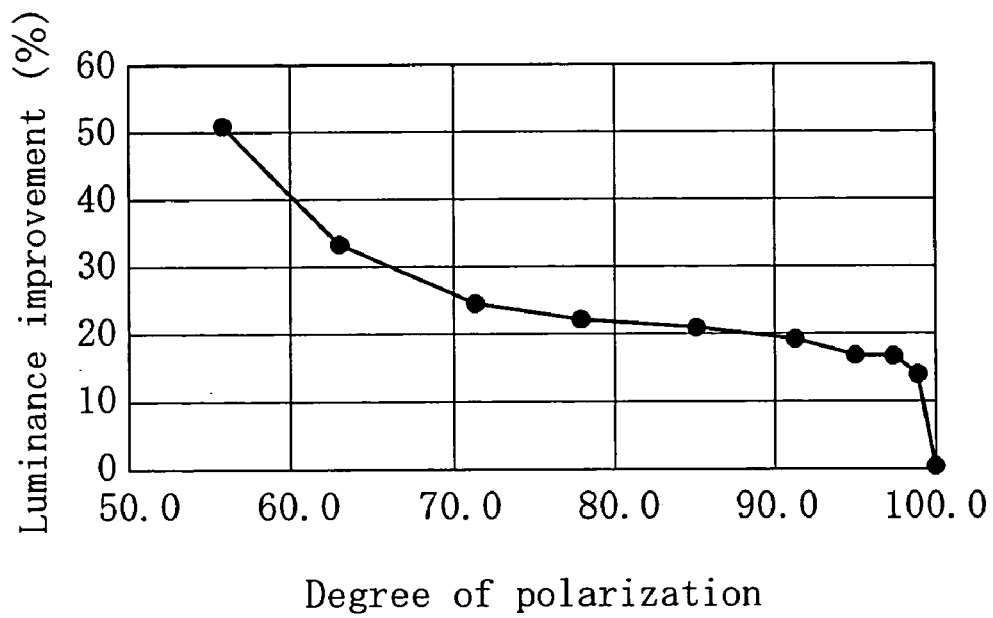
FIG. 4 is a graph illustrating the relationship between the degree of polarization and the luminance improvement.

It can be seen from FIG. 4 that the decrease in the luminance improvement for the increase in the degree of polarization has substantially the same tendency as that of the decrease in the luminance illustrated in FIG. 3. Specifically, in the range of degree of polarization from 50 to 70, the luminance decreases relatively substantially from near 50% to about 25% as the degree of polarization increases. In contrast, in the range of degree of polarization in percent from 70 to the high 90's, the decrease in the luminance improvement for the increase in the degree of polarization is relatively small, with the luminance improvement staying in the range from 14 to 25%. It can be seen that particularly in the range where the degree of polarization is 85.0% or less, the luminance improvement in percent is at a very high level in the 20's.

Figure 6:
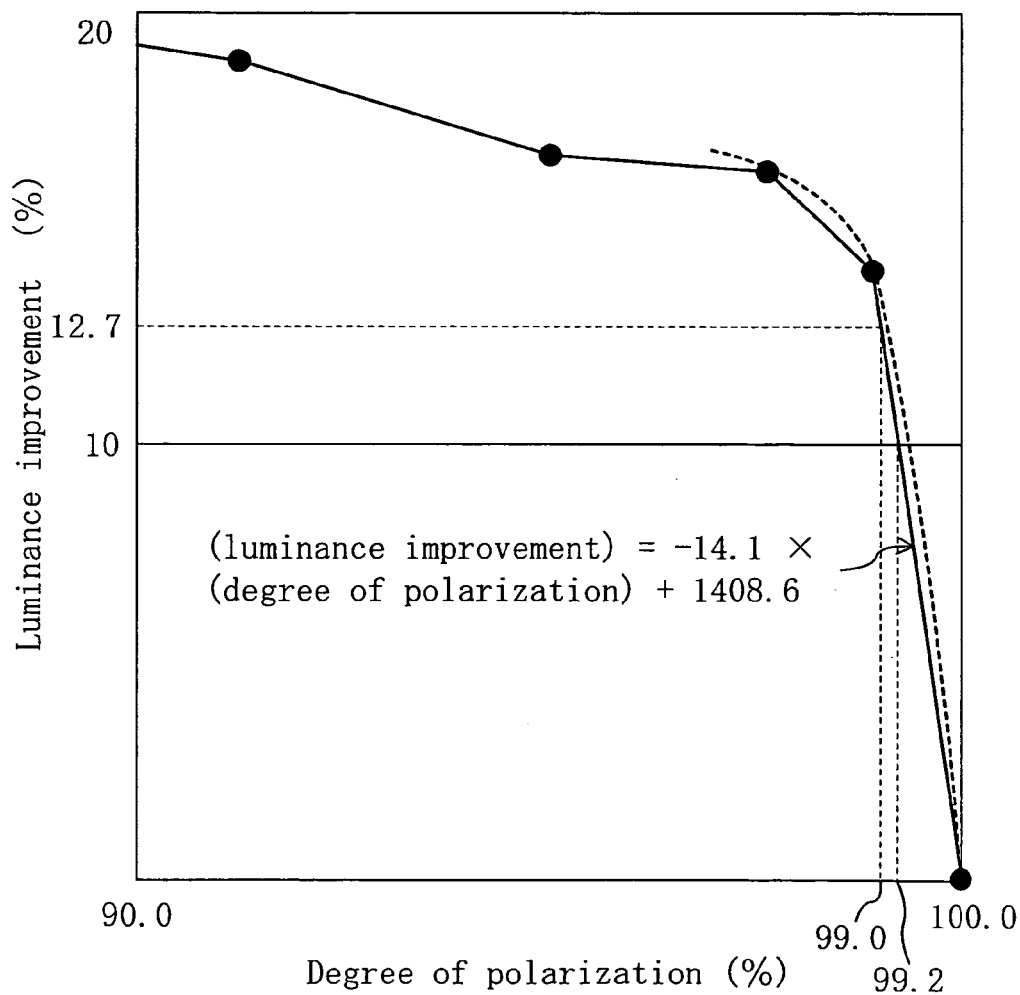
FIG. 6 is a graph illustrating a portion of FIG. 4 on an enlarged scale.
Figure 7:
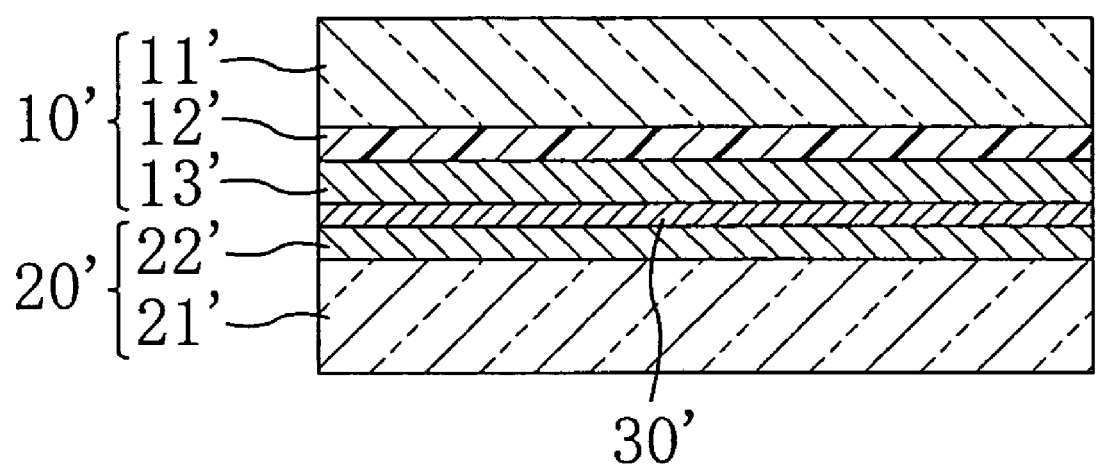
FIG. 7 is a schematic cross-sectional view illustrating a conventional organic EL display.

The luminance improvement for the degree of polarization of 99.0% can be estimated as follows. Expression (1) below can be obtained as an expression for the straight line between the luminance improvement data points for Sample 9 and Sample 10, which is shown in a solid line in FIG. 6.

$$(\text{luminance improvement}) = -14.1 \times (\text{degree of polarization}) + 1408.6 \quad (1)$$

Substituting (degree of polarization)=99.0% into this expression yields (luminance improvement)=12.7%. It is expected that the luminance improvement decreases in an upwardly-protruding curve as shown in broken line in FIG. 6 in the range of degree of polarization from 90 to 100%. Therefore, it is believed that the luminance improvement for the degree of polarization of 99.0% is actually higher than 12.7%. Therefore, it can be estimated that the luminance improvement is at least 12.7% or more for the degree of polarization of 99.0%. Moreover, substituting (luminance improvement)=10.0% into Expression (1) above yields (degree of polarization)=99.2%. Therefore, it can be estimated that the luminance improvement is 10.0% or more when using a linear polarization plate whose degree of polarization is 99.2% or less.

Figure 5:
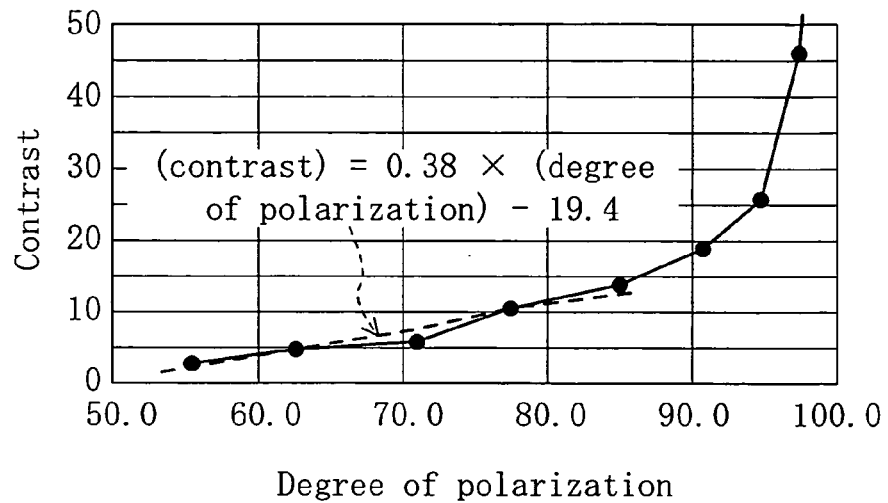
FIG. 5 is a graph illustrating the relationship between the degree of polarization and the contrast.

It can be seen from FIG. 5 that in the range of degree of polarization from 50 to around 85%, the contrast increases substantially linearly as the degree of polarization increases. In contrast, in the range of degree of polarization over 85%, the contrast increases exponentially as the degree of polarization increases.

The luminance improvement for the degree of polarization of 70.0% can be estimated as follows. Expression (2) below can be obtained as an expression for the approximated straight line passing through the contrast data points for Samples 1 to 5 (in the range of degree of polarization from 50 to around 85%), which is shown in a broken line in FIG. 5.

$$(\text{contrast}) = 0.38 \times (\text{degree of polarization}) - 19.4 \quad (2)$$

Substituting (degree of polarization)=70.0% into this expression yields (contrast)=7.2. Therefore, it can be estimated that although the contrast is slightly low at 5.4 for Sample 3, which is a linear polarization plate whose degree of polarization is 71.3%, it is possible to reliably obtain a contrast of 5.0 or more if the degree of polarization is greater than 70.0%. Moreover, substituting (contrast)=10.0 into Expression (2) above yields (degree of polarization)=77.4%. Therefore, it can be estimated that the contrast is 10.0 or more when using a linear polarization plate whose degree of polarization is 77.4% or more, or 78.0% or more for an even higher reliability.

Therefore, it is believed that a contrast of 5.0 or more can be obtained reliably if the degree of polarization of the linear polarization plate is greater than 70.0%. Moreover, it is believed that if the degree of polarization is 78.0% or more, the contrast is equal to or greater than 10.0, i.e., substantially twice as high as that for a degree of polarization of 50 to 70%. Furthermore, it is believed from FIG. 5 that if the degree of polarization is 90.0% or more, the contrast is equal to or greater than 15.0, i.e., substantially three times as high as that for a degree of polarization of 50 to 70%. Moreover, it is believed that if the degree of polarization is 95.0% or more, the contrast is equal to or greater than about 25.0, i.e., substantially five times as high as that for a degree of polarization of 50 to 70%. Moreover, it is believed that if the degree of polarization is 97.0% or more, the contrast is equal to or greater than about 45.0, i.e., substantially ten times as high as that for a degree of polarization of 50 to 70%.

Thus, in order to improve the luminance, it is preferred to use a linear polarization plate whose degree of polarization is 99.0% or less, whereby a luminance improvement of 10.0% or more is obtained. More preferably, a linear polarization plate whose degree of polarization is 85.0% or less is used, in which case the luminance improvement is 20.0% or more.

On the other hand, in order to obtain a very high contrast while also improving the luminance to a certain degree, it is preferred to use a linear polarization plate whose degree of polarization is 90.0 to 99.0%, in which case the luminance improvement is 10.0% or more while the contrast is 15.0 or more. More preferably, the degree of polarization is 95.0 to 99.0%, in which case the luminance improvement is 10.0% or more while the contrast is 25.0 or more. Even more preferably, the degree of polarization is 9.70 to 99.0%, in which case the luminance improvement is 10.0% or more while the contrast is 45.0 or more.

INDUSTRIAL APPLICABILITY

The self-luminous image display apparatus of the present invention is suitable for applications where a high-contrast display is required.

The invention claimed is:

1. A self-luminous image display apparatus, comprising an output section for displaying an image, a reflection section provided on a rear side of the output section with a reflective surface thereof facing the output section, and a light-emitting section provided on the rear side of the output section, wherein:
   the output section includes a linear polarization device provided so as to cover a display surface for transmitting only predetermined linearly-polarized light of ambient light, and a retardation film provided closer to the light-emitting section than the linear polarization device for turning the linearly-polarized light transmitted through the linear polarization device into circularly-polarized light; and
   the linear polarization device has a degree of polarization greater than 70.0% and less than 99.0%.

2. The self-luminous image display apparatus of claim 1, wherein the linear polarization device has a degree of polarization of 78.0% or more.

3. The self-luminous image display apparatus of claim 1, wherein a display mode of the self-luminous image display apparatus is an organic electroluminescence display mode.

4. A self-luminous image display apparatus, comprising an output-side substrate, a reflection-side substrate provided so as to oppose the output-side substrate, and a light-emitting layer provided so as to be interposed between the substrates, wherein light from the light-emitting layer is output directly from the output-side substrate and is output indirectly from the output-side substrate after being reflected by the reflection-side substrate, wherein:
   the output-side substrate includes a linear polarization device provided so as to cover a display surface for transmitting only predetermined linearly-polarized light of ambient light, and a retardation film provided closer to the light-emitting layer than the linear polarization device for turning the linearly-polarized light transmitted through the linear polarization device into circularly-polarized light; and
   the linear polarization device has a degree of polarization greater than 70.0% and less than 99.0%.

5. The self-luminous image display apparatus of claim 4, wherein the linear polarization device has a degree of polarization of 78.0% or more.

6. The self-luminous image display apparatus of claim 4, wherein a display mode of the self-luminous image display apparatus is an organic electroluminescence display mode.

7. The self-luminous image display apparatus of claim 1, wherein a display mode of the self-luminous image display apparatus is an inorganic electroluminescence display mode.

8. The self-luminous image display apparatus of claim 1, wherein a display mode of the self-luminous image display apparatus is a field emission display mode.

9. The self-luminous image display apparatus of claim 1, wherein a display mode of the self-luminous image display apparatus is a plasma display mode.

10. The self-luminous image display apparatus of claim 1, wherein a display mode of the self-luminous image display apparatus is a cold-cathode tube display mode.

11. The self-luminous image display apparatus of claim 1, wherein a display mode of the self-luminous image display apparatus is a light-emitting diode display mode.

12. The self-luminous image display apparatus of claim 4, wherein a display mode of the self-luminous image display apparatus is an inorganic electroluminescence display mode.

13. The self-luminous image display apparatus of claim 4, wherein a display mode of the self-luminous image display apparatus is a field emission display mode.

14. The self-luminous image display apparatus of claim 4, wherein a display mode of the self-luminous image display apparatus is a plasma display mode.

15. The self-luminous image display apparatus of claim 4, wherein a display mode of the self-luminous image display apparatus is a cold-cathode tube display mode.

16. The self-luminous image display apparatus of claim 4, wherein a display mode of the self-luminous image display apparatus is a light-emitting diode display mode.

* * * * *